United States Patent [19]

Yoshida

[11] Patent Number: 5,274,656
[45] Date of Patent: Dec. 28, 1993

[54] SEMICONDUCTOR LASER

[75] Inventor: Ichiro Yoshida, Yokohama, Japan

[73] Assignee: Sumitomo Electric Industries, Ltd., Japan

[21] Appl. No.: 892,805

[22] Filed: Jun. 8, 1992

[30] Foreign Application Priority Data

Jun. 12, 1991 [JP] Japan .................................. 3-140135
Jun. 28, 1991 [JP] Japan .................................. 3-158841

[51] Int. Cl.$^5$ .............................................. H01S 3/19
[52] U.S. Cl. ........................................ 372/45; 372/46
[58] Field of Search ............................ 372/45, 46, 43

[56] References Cited

U.S. PATENT DOCUMENTS

| | | | |
|---|---|---|---|
| 4,328,469 | 5/1982 | Scifres et al. | 372/45 |
| 4,974,231 | 11/1990 | Gomyo | 372/45 |
| 4,982,409 | 1/1991 | Kinoshita et al. | 372/45 |
| 4,984,242 | 1/1991 | Scifres et al. | 372/45 |

FOREIGN PATENT DOCUMENTS

| | | | |
|---|---|---|---|
| 348941 | 1/1990 | European Pat. Off. | |
| 380322 | 8/1990 | European Pat. Off. | |
| 0279689 | 12/1987 | Japan | 372/45 |
| 2099624 | 12/1992 | United Kingdom | |

OTHER PUBLICATIONS

M. Okamoto et al, "A Novel Structure for TM Mode Gain Enhancement in Long Wavelength Strained Superlattice Laser Diodes with the Tensile Stress on the Barrier Layers", *Japanese Journal of Applied Physics, Supplements Extended Abstracts 22th Conference on Solid State Devices and Materials* (1990), 1990, Tokyo, Japan, pp. 549-552.

J. Hashimoto et al, "Effects of Strained Layer Structures on the Threshold Current Density of AlGaInP-/GaInP Visible Lasers", *Applied Physics Letters*, vol. 58, No. 9, New York, U.S., pp. 879-880 (4 Mar. 1991).

K. Magari et al, "Polarisation Insensitive Travelling Wave Amplifier using Strained Multiple Quantum Well Structure", *IEEE Photonics Technology Letters*, vol. 2, No. 8, pp. 556-558, New York, U.S. (Aug. 1990).

T. Takagi et al, "Modified Multiquantum Barrier for 600 nm Range AlGaInP Lasers", *Electronics Letters*, vol. 27, No. 12, Stevenage, Herts, GB, pp. 1081-1082 (Jun. 1991).

K. Kishino et al, "Enhanced Carrier Confinement Effect by the Multiquantum Barrier in 660 nm GaInP-/AlInP Visible Lasers", *Applied Physics Letters*, vol. 58, No. 17, New York, U.S., pp. 1822-1824 (29 Apr. 1991).

*Primary Examiner*—Georgia Y. Epps
*Attorney, Agent, or Firm*—Beveridge, DeGrandi, Weilacher & Young

[57] ABSTRACT

A p-clad layer constituting the semiconductor laser device according to this invention includes an inner clad area near an active layer, and an outer clad area remote from the active layer. The outer clad area has a narrower bandgap than that of the inner clad area, the thickness and the composition of the inner clad area are so set that beams do not substantially exude from the active layer to the outer clad area. A multi-quantum barrier structure can be provided between the active layer and the p-clad layer. At least one of barrier layers of the multi-quantum barrier structure is formed of a material which applies tensile stress thereto, and at least one well layer, provided between one of the barrier layers and its adjacent one, is formed of a material which applies contraction stress thereto, whereby an average lattice constant of the multi-quantum barrier agrees with that of the substrate. The material in the barrier layers allows the bandgap thereof to be sufficiently wide. Consequently even in comparatively high-temperature environments, carriers, especially electrons, can be prevented from overflowing from the active layer to the clad layers, and no deterioration of the characteristics takes place.

11 Claims, 6 Drawing Sheets

SEMICONDUCTOR LASER

BACKGROUND OF THE INVENTION

1. Field of the Invention

This invention relates to a semiconductor laser device for use in laser printers, optical disks, bar code scanners and so on.

2. Related Background Art

As semiconductor laser devices, those which emit beams near 670 nm are already known. Such semiconductor laser devices have a structure in which an active layer of gallium/indium/phosphorus (GaInP) is sandwiched by a p-type and an n-type clad layer of aluminium/gallium/indium/phosphorus (AlGaInP) (refer to, e.g., "Control of Perpendicular Radiation Angle of AlGaInP Visible Semiconductor Laser", 28a-ZG-9, The 1989 Autumn Convention of The Society of Applied Physics). But in the above-described semiconductor laser devices the p-type clad layer tends to have high temperatures because AlGaInP has higher heat resistance compared with other semiconductors, such as AlGaAs, etc. To suppress the heating of the p-type clad layer it has been tried to decrease the resistivity of the p-type clad layer of AlGaInP by increasing a doping amount of the p-type clad layer, but because increases in a doping amount of the p-type clad layer adversely lowers an activation ratio of the dopant, it is impossible to decrease the resistivity of the p-type clad layer of AlGaInP. This phenomenon takes place also in the case that zinc atoms (Zn), magnesium atoms (Mg) and so on, which are major p-type dopants of the clad layer of AlGaInP, are doped. This phenomenon of drops of activation ratios of the dopants becomes more conspicuous as the Al composition ratio of the clad layer is increased. Thus, when the Al composition ratio of the clad layer is determined, a minimum value of the resistivity of the clad layer is substantially determined, and a minimum heat generation amount of the laser devices is also determined.

In lowering the Al composition ratio of the p-type clad layer for this reason so as to suppress decreases in an activation ratio of the dopant, it is impossible to efficiently confine carriers in the active layer. This is a cause for deterioration of the characteristics of the semiconductor laser devices. In short, higher Al composition ratios are preferable to efficiently confine carriers in the active layer. As seen from the above, increases in the efficiency of confining carriers, and the suppression of heat generation in the semiconductor laser devices are on opposite in terms of degrees of the Al composition ratio.

A first object of this invention is to provide a semiconductor laser device having high efficiency in confining carriers but a small heat generation amount.

To shorten oscillation wavelengths of the semiconductor laser devices, a bandgap of the active layer is widened. But this results in a problem that a difference in the bandgap between the active layer and the clad layer becomes smaller, and the confinement of carriers, especially electrons, is deteriorated, characteristics of the devices in high-temperature operations being deteriorated. To solve this problem a method of using multi-quantum barriers between the active layer and the p-type clad layer (e.g., Electronics Letters, 1986, vol. 22, p. 1008; 27 p-R-2, The 1990 Autumn Convention of The Society of Applied Physics) has been proposed.

But even by the use of this method, sufficiently high barriers have not been able to be obtained. In terms of the confinement of carriers, so far satisfactory effects have not been always achieved.

A second object of this invention is to provide a semiconductor laser device which can solve this problem and have barriers of wide bandgaps.

SUMMARY OF THE INVENTION

In a semiconductor laser device according to a first embodiment of the invention, a p-type clad layer containing aluminium, gallium, indium and phosphorus includes an inner clad area adjacent to an active layer, and an outer clad area remote from the active layer, the outer clad area having a smaller bandgap compared with that of the inner clad area, a thickness and a composition of the inner clad area being so set that a beam can substantially exude from the active layer to the outer clad area.

The outer clad area may be $(Al_xGa_{1-x})_{0.5}In_{0.5}P$ $(0.4 \leq x \leq 0.8)$, and the inner clad area may be $(Al_yGa_{1-y})_{0.5}In_{0.5}P$ $(0.7 \leq y \leq 1.0, (x+0.1) \leq y)$. It is possible that a thickness of the inner clad area is 50–200 Å. It is also possible that the inner clad area has a composition which has tensile distortion with respect to the active layer. In the visible semiconductor laser device according to the first invention, a bandgap of the inner clad area adjacent to the active layer is large enough for carriers to be efficiently confined in the active layer.

Here, to increase a bandgap of the inner clad area, the inner clad area may have, for example, a low Al composition ratio, but may be thinned. If the inner clad area is formed of $Al_{0.57}In_{0.43}P$, the inner clad area does not lattice-match with GaAs, but the bandgap can be widened. $(Al_{0.5}Ga_{0.5})_{0.6}In_{0.4}P$ and $(Al_{0.6}Ga_{0.4})_{0.5}In_{0.5}P$ have the same Al composition, but the former has a wider bandgap.

On the other hand, the thickness of the inner clad area may be small as long as electrons do not substantially leak from the active layer due to the tunnel effect. A thinner inner layer has an advantage of a smaller series resistance. The inner layer usually has a thickness of about 100 Å, but the range of 50–200 Å is sufficient. The inner clad area may have a composition which has tensile stress with respect to the active layer, whereby a higher barrier can be formed. The Al composition ratio of the outer clad area may be made low, whereby the resistivity of the outer clad area can be low, and the series resistance of the p-clad layer as a whole can be made comparatively easily small.

In the semiconductor laser device according to a second embodiment of the invention, a barrier structure is formed between an active layer and a p-type clad layer, and the barrier structure is formed of a material which has tensile stress with respect to the active layer and the p-type clad layer.

By forming the barrier structure of a material which has tensile stress with respect to the active layer and the p-type clad layer, the bandgap can be wide. Consequently the overflow of carriers, especially electrons, from the active layer to the clad layer can be more efficiently prevented. But it is preferable that the amount of the distortion caused in the barrier structure, and the thickness of the barrier structure have values which can prevent dislocations. The barrier structure may be of a single-barrier layer or multi-barrier layers. In the multi-barrier layer-barrier structure, a material for which it is feasible to contraction stress is provided at an narrow bandgap area between one of the barrier layers and its adjacent one, whereby distortion which is counter to the distortion of the barrier layers can be caused, and distortion as a whole can be mitigated. Conveniently in this case, a distortion amount as a whole can be decreased also by increasing a distortion amount per one barrier layer, i.e., increasing an effective height of the barrier layer.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENTS

Figure 1:
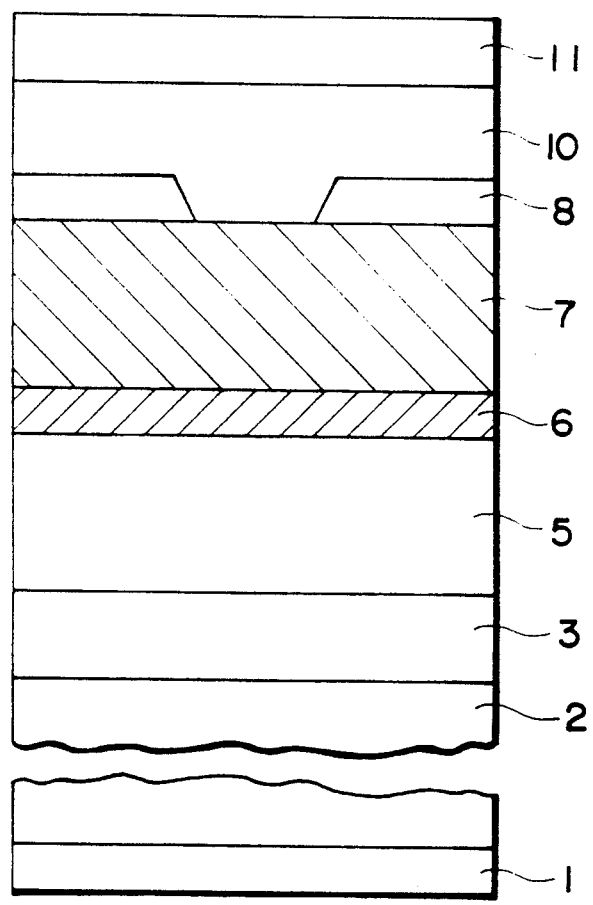
FIG. 1 is a sectional view of an embodiment of the visible semiconductor laser device according to a first embodiment of the invention.

FIG. 1 is a sectional view of the semiconductor laser device according to a first embodiment of the invention. In the laser device of FIG. 1, an n-type buffer layer 3 of, e.g., GaAs is formed on the top surface of a substrate 2 of, e.g., GaAs with an n-type electrode 1 formed on. On this buffer layer 3 there are formed an n-type clad layer 5, an active layer 6 and a p-type clad layer 7 in the stated sequence. The n-type clad layer 5 is formed of n-type AlGaInP of a uniform Al composition ratio, and the active layer 6 is formed of non-doped GaInP. The p-type clad layer 7 is formed of p-type AlGaInP. Both clad layers 5, 7 have a higher refractive index than the active layer 6.

On the p-type clad layer 7 an n-type semiconductor layer 8 of, e.g., GaAs is patterned to form a current limiting structure. On the n-type semiconductor layer 8 there are formed a p-type contact layer 10 of e.g., GaAs, and a p-type electrode 11 in the stated sequence.

Next with reference to FIG. 2, an Al composition ratio X of the p-type clad layer 7, and a carrier density distribution thereof characterizing this invention will be explained.

Figure 2:
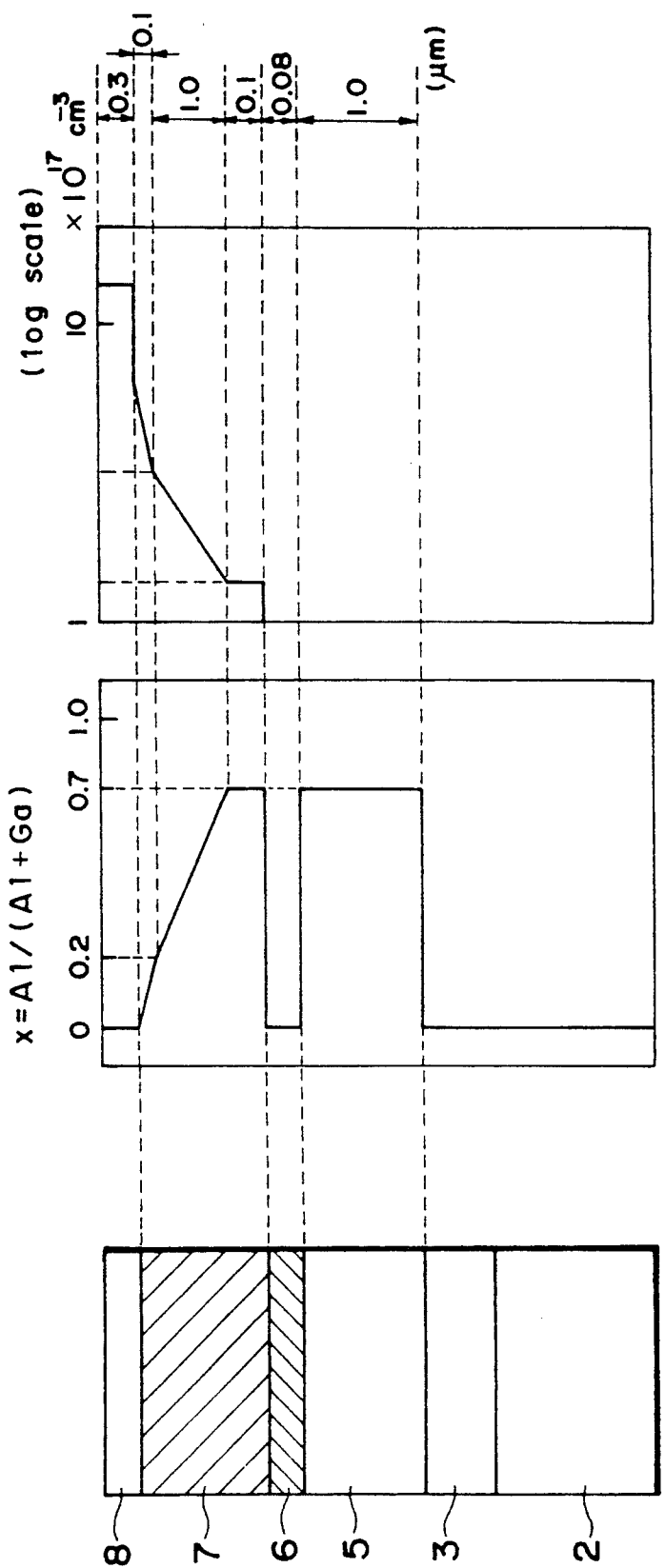
FIGS. 2(A) through 2(C) are views of an Al composition ratio of a clad layer of the visible semiconductor laser device according to the first embodiment of the invention, and of a carrier density of the p-type clad layer thereof.

A part (a) of FIG. 2 shows a part of a section of the semiconductor laser device of FIG. 1, and Parts (b) and (c) of FIG. 2 respectively show Al composition ratios $\chi$ and carrier densities respectively taken on the horizontal axis corresponding to the respective sectional layers of the part (a) of FIG. 2. In the part (c) of FIG. 2 the horizontal axis has a logarithmic scale.

As seen in the part (b) of FIG. 2, the Al composition ratio of the p-type clad layer 7 is higher at the inner clad area near the active layer 6 and decreases from a point distant from the active layer 6 continuously toward points increasingly distant from the active layer 6 (in the outer clad area). By keeping the Al composition ratio $\chi$ of the inner clad area, which is very influential to carrier confinement, thus high, carriers can be efficiently confined in the active layer 6. By decreasing the Al composition ratio $\chi$ in the outer clad area distant from the active layer 6, which is not very influential to carrier confinement, the decrease of an activation ratio of the dopants added there is suppressed. Consequently the carrier density in the outer clad area can be increased as shown in the part (c) of FIG. 2, the resistivity of the outer clad area can be decreased, and the series resistance of the p-type clad layer 7 as a whole can be lowered.

As seen from the above, only by keeping the Al composition ratio of the outer clad area low, the carrier density of the outer clad area can be increased without increasing a doping amount of the outer clad area. It is possible to increase the carrier density of the outer clad area also by making a doping amount of the outer clad area larger than that of the inner clad area.

The semiconductor laser device of FIG. 1 was fabricated by low-pressure OMVPE (Organic Metallic Vapor Phase Epitaxy) using trimethylaluminium, triethylgallium, trimethylindium, diethylzinc, disilane and phosphine, and was actually operated for comparison with semiconductor laser devices including p-type clad layers having uniform Al composition ratios. It was confirmed that the heating characteristic of the p-type clad layer in a continuous oscillating operation was improved. Since the area of the p-type clad layer 7 having a high Al composition ratio is thicker, the function of confining a beam in the active layer 6 is deteriorated, and the beam substantially exudes into the outer clad area remote from the active layer 6. As a whole, however, the beam is confined in the laser device, and the beam exudation causes no problem. To the contrary, a beam density is lowered preferably to the beam emitting operation.

As seen from the above, the semiconductor laser device according to this invention can produce better results than semiconductor laser devices having uniform Al composition ratios. To fabricate an optimum semiconductor laser device depending on operational conditions and so on, it is preferable to use the following method.

First, relationships between an Al composition ratio $\chi$ of a material of the p-type clad layer and a resistivity thereof on suitable growth conditions are given. Using as parameters characteristics of a laser device which are dependent on a composition distribution of the p-type clad layer, such as heat amounts, emission angles, maximum beam density at end surfaces, and threshold current values at different temperatures, a function "F" indicative of excellency in the performance of a laser device is given. A value of this function is given based on the parameters corresponding to a laser device to be fabricated. Then suitable growth conditions of the p-type clad layer are assumed, and characteristics of the laser device are presumed by the known simulation method so as to give "F", which is a measure indicative of excellency in the laser device. The same simulation is conducted on various composition distributions of the p-type clad layer to obtain the optimum "F", and the composition distribution corresponding to the optimum "F" is most suitable for the p-type clad layer. It is preferable to conduct the simulation multi-dimensionally, e.g., two-dimensionally, three dimensionally and so on, if necessary. Ordinarily, however, it is sufficient to one-dimensionally conduct the simulation.

This invention is not limited to the above-described embodiment and covers additional variations.

Figure 3:
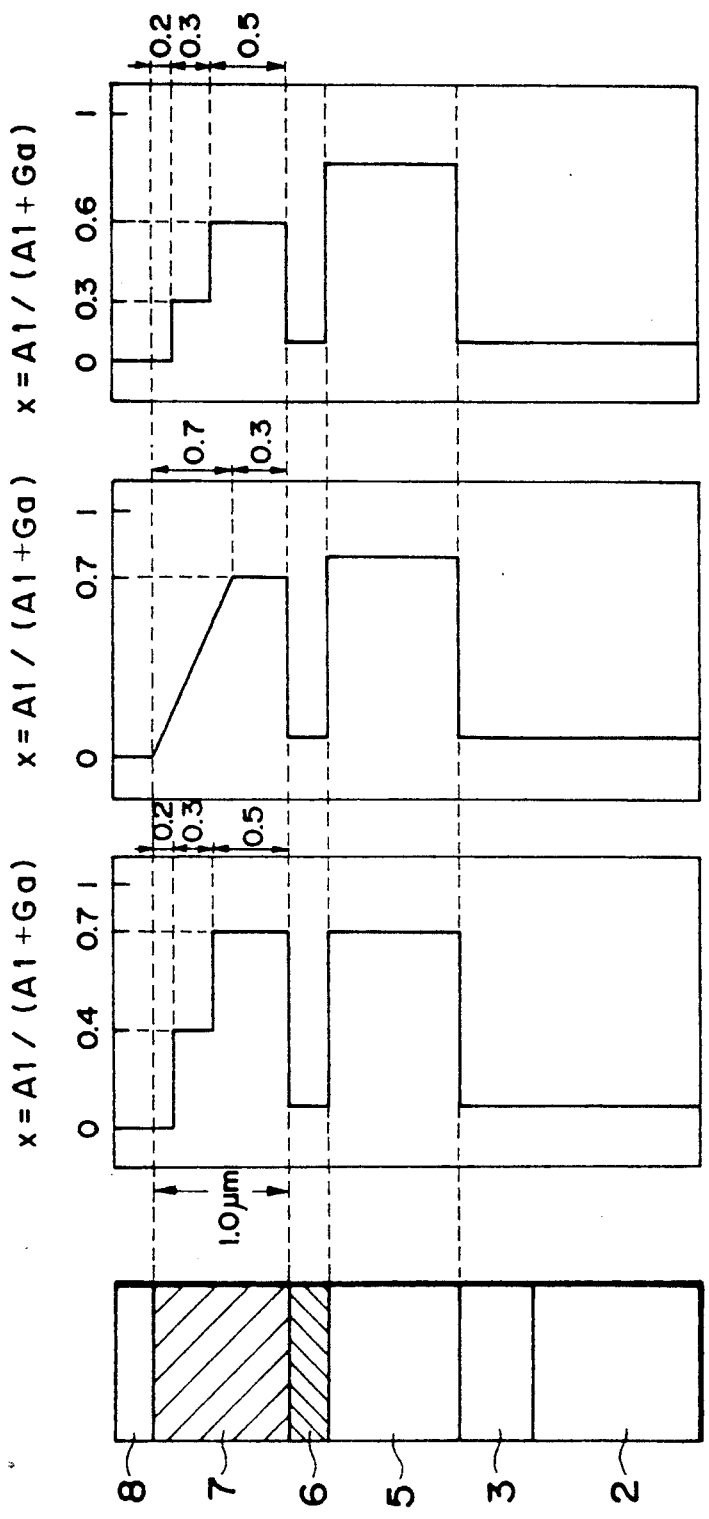
FIGS. 3(A) through 3(D) are views of a variation of the Al composition ratio of the clad layer of the visible semiconductor laser device according to the first embodiment of the invention.
Figure 4:
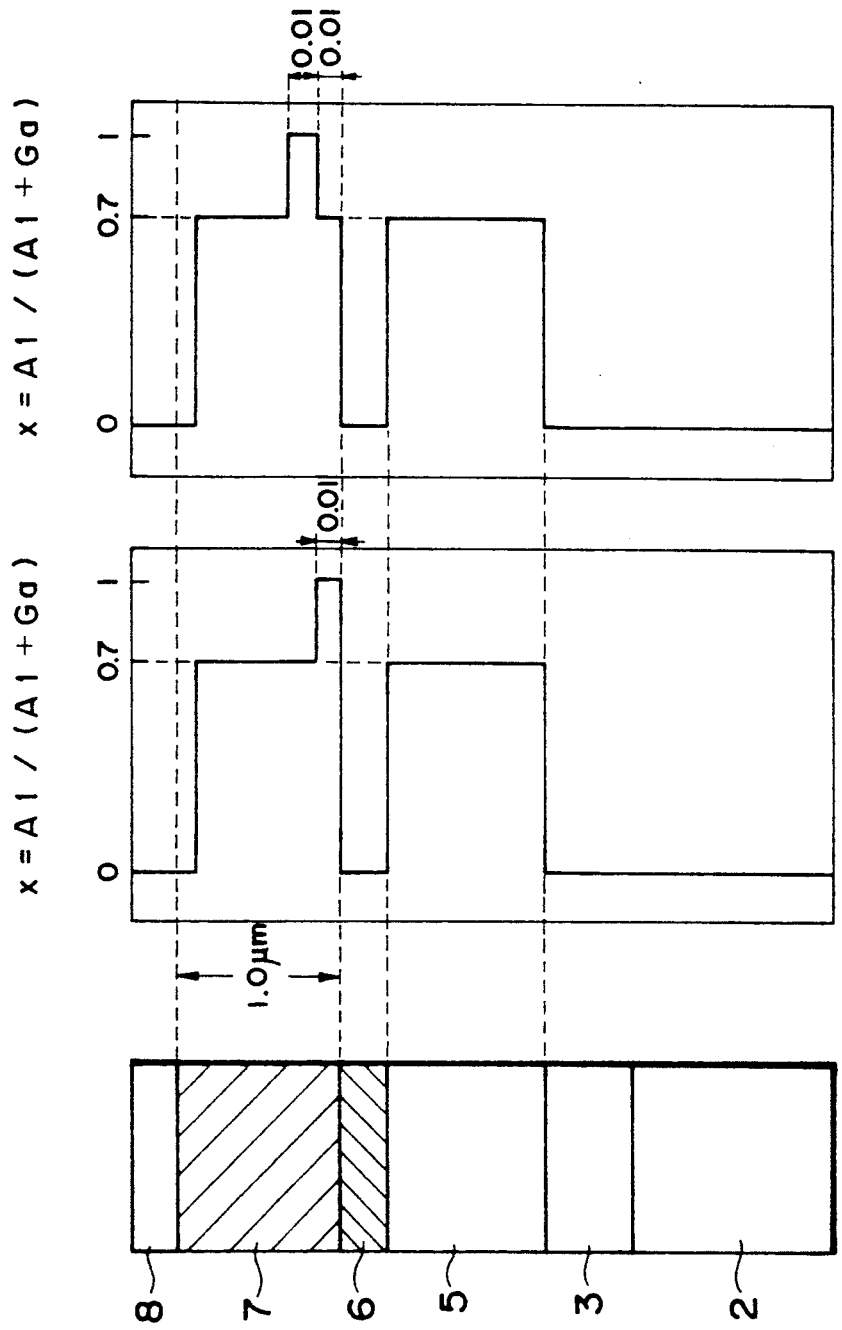
FIGS. 4(A) through 4(C) are views of a variation of the Al composition ratio of the clad layer of the visible semiconductor laser device according to the first embodiment of the invention.

For example, variations of this invention having different Al composition ratios $\chi$ of the p-type clad layer as shown in FIGS. 3 and 4 can be proposed. Parts (a) of FIGS. 3 and 4 respectively show parts of sections of the semiconductor laser devices according to the proposed variations. Parts (b)-(d) of FIG. 3 and parts (b) and (c) of FIG. 4 show changes of the Al composition ratios of the p-type clad layer of the respective semiconductor laser devices. As shown, the Al composition ratio of the p-type clad layer changes in steps in parts (a) and (b) of FIG. 3 and continuously in FIG. 3. The structure parts (a) and (c) of FIG. 4 and includes a thin barrier of 0.01 $\mu m$ (100 Å) formed very near an active layer 6. The area of $Al/(Al+Ga)=1$ may be doped with a p-type impurity by Zn diffusion from an outer clad area. That is, it is not essentially necessary to intentionally dope the area with a p-type dopant during the crystal growth. This area may be formed of $Al_zIn_{1-z}P_{(z\,0.5)}$ in place of $Al_{0.5}In_{0.5}P$, which lattice-matches with GaAS. For example, with $z=0.57$, the layer can have a thickness of 100 Å.

In the above-described embodiment the n-type clad layer has a uniform Al composition ration $\chi$. This is generally preferable, but it is possible that similarly with the p-type clad layer 7, the n-type clad layer 5 has a higher Al composition ratio in an area near the active layer 6 and a lower Al composition ratio in an area remote from the active layer 6. Otherwise completely different composition distributions are also possible.

As described above, according to the visible semiconductor laser device according to the first embodiment of the invention, the inner clad area adjacent to the active layer has a wider bandgap, and carriers can be efficiently confined in the active layer, and the outer clad area can have a comparatively low resistivity. Thus, a visible semiconductor laser device which can efficiently confine carriers in the active layer, and has small series resistances and small heat generation amounts can be provided.

Figure 5:
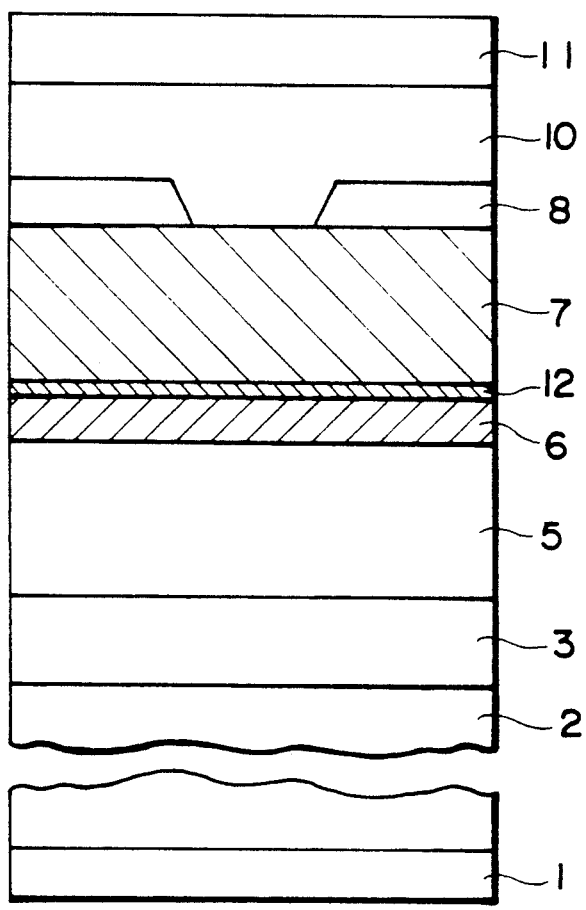
FIG. 5 is a view of the visible semiconductor laser device according to a second embodiment of the invention.

FIG. 5 is a sectional view of the visible semiconductor laser device according to another embodiment of this invention. In comparison with the embodiment of FIG. 1, a difference in this embodiment is that a multi-quantum barrier structure 12 is provided between the active layer 6 and the p-type clad layer 7. The embodiment of FIG. 5 is the same as that of FIG. 1 in the n-type electrode 1, the substrate 2, the buffer layer 3, the n-type semiconductor layer 8, the contact layer 10 and the p-type electrode 11.

Figure 6:
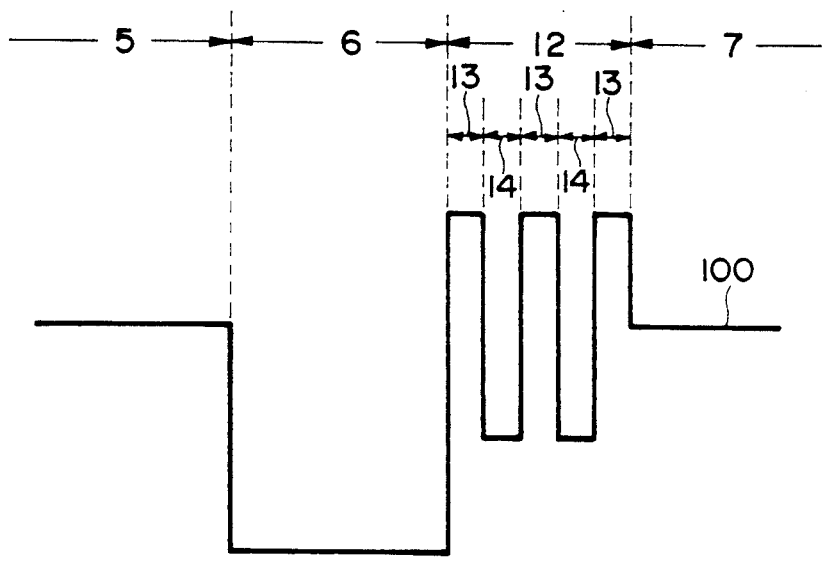
FIG. 6 is a view of an energy band near an active layer of the visible semiconductor laser device according to an implementation of the second embodiment of the invention.

FIG. 6 is an energy band diagram of the semiconductor laser device according to the embodiment of FIG. 5 near the active layer. The solid line 100 indicates a conductor band level. In this the semiconductor laser device the substrate is a GaAs substrate, the active layer 6 is formed of undoped $(Al_{0.2}Ga_{0.8})_{0.5}In_{0.5}P$, the n-type clad layer 5 is formed of n-type $(Al_{0.7}Ga_{0.3})_{0.5}In_{0.5}P$, and the p-type clad layer 7 is formed of p-type $(Al_{0.7}Ga_{0.3})_{0.5}In_{0.5}P$. The multi-quantum barrier structure 12 is formed of p-type $(Al_{0.7}Ga_{0.3})_{0.6}In_{0.4}P$ as barrier layers 13, and p-type $(Al_{0.7}Ga_{0.3})_{0.4}In_{0.6}P$ as well layers 14.

According to this embodiment, the barrier layers 13 are formed of a material having a wide bandgap, and the outflow of carriers from the active layer 6 to the p-type clad layer 7 can be effectively prevented. But on the other hand, this material does not lattice-match with the GaAs substrate, and the barrier layers 13 are under tensile stress. Even if a thickness of each barrier layer 13 is below a critical film thickness, dislocations may occur unless any countermeasure is taken. As a countermeasure, in this embodiment the well layers are formed of a material which has distortion exerted in a direction opposite to the tensile stress applied to the barrier layers 13, so that an average lattice constant of the barrier layers 13 and the well layers 14 $\cdot$., a lattice constant of the multi-quantum barrier structure 12, agrees with that of the substrate for the lattice matching therebetween. Accordingly no dislocations take place. In the case that a material containing Al in a large amount that allows the barriers to be raised with the lattice-matching secured is used as has been done conventionally, it is difficult to add p-type dopant impurities (usually Zn). But in this embodiment where the barriers are raised with the Al composition ratio kept comparatively low, the doping is easy. What has to be noted in designing the film thickness of the barrier layers 13 and that of the well layers 14 are that a thickness of each layer is below a critical film thickness for the distortion of the layer so as to prevent the generation of dislocations, and that the effect of the barrier structure against electrons is maximized as much as possible within a dislocation preventive range.

The respective layers of the semiconductor laser device according to this embodiment can be formed by OMVPE (Organic Metallic Vapor Phase Epitaxy). What has to be noted in forming the layers, the growth conditions are so set that diffusion of p-type dopants (usually Zn) does not damage the multi-quantum barriers. According to experiments made by the inventors, in the case that the layers were grown by OMVPE at 700° C. with a feed ratio between Zn and a III Group raw material set at 1, the multi-quantum barrier was left undamaged in about 70 Å, and there was no problem.

In this embodiment, the barrier layers 13 are formed of p-type $(Al_{0.7}Ga_{0.3})_{0.6}In_{0.4}P$, and the well layers 14 are formed of p-type $(Al_{0.7}Ga_{0.3})_{0.4}In_{0.6}P$. To be general, the effect of this invention can be achieved in the case that $1 \geq b > 0.5 \geq d \geq 0$ when the barrier layers 13 are formed of p-type $(Al_aGa_{1-a})_bIn_{1-b}P$, and the well layers 14 are formed of p-type $(Al_cGa_{1-c})_dIn_{1-d}P$. The subscripts a and c are usually $1 \geq a \geq c \geq 0$, but when a distortion amount is sufficiently large, $a < c$ is possible. Composition ratios (subscripts a, b, c, and d) of the respective barrier layers, and those of the well layers may be respectively different from one another. Conditions for preventing occurrences of dislocations may be experimentally determined in accordance with these constants.

In the above-described embodiment, the barrier to electrons is multi-quantum barriers structure but is not essentially quantum barriers. In place of the multi-quantum barrier structure, for example, a multi-barrier structure having no quantum effects is proposed. The structure includes three 70 Å-thickness barrier layers of $(Al_{0.7}Ga_{0.3})_{0.57}In_{0.43}P$, and 50 Å-thickness layers of $(Al_{0.7}Ga_{0.3})_{0.52}In_{0.48}P$ interposed between one of the barrier layers and its adjacent one, the layers having a smaller bandgap than the barrier layers.

Figure 7:
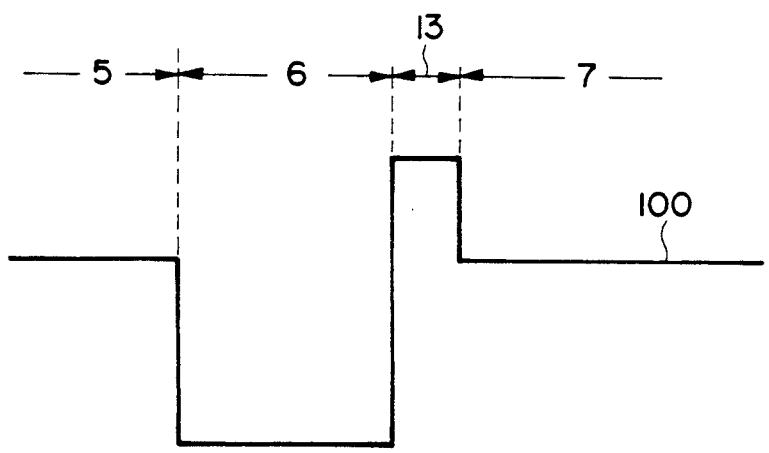
FIG. 7 is a view of an energy band near an active layer of the visible semiconductor laser device according to another implementation of the second embodiment of the invention.

The barrier structure for electrons may be of a single layer. As shown in FIG. 7 for example, one 100 Å-thickness layer of $Al_{0.57}In_{0.43}P$ may be interposed between an active layer and a p-type clad layer.

The semiconductor laser device according to all the above-described embodiments have the active layer formed of AlGaInP, but the semiconductor laser device according to this invention is not limited to them. For example, in a semiconductor laser device having an active layer formed of GaInAs, the multi-barrier structure can be a combination of barrier layers of AlGaInAsP and AlGaInAs, and layers having a narrower bandgap for separating the barrier layers from each other.

As described above, in the semiconductor laser device according to this invention the barrier layers are formed of materials which have tensile stress, whereby the barrier is raised to prevent carriers, especially electrons, from overflowing from the active layer to p-type clad layer. Consequently even when the semiconductor laser device is operated at high environmental temperatures, deterioration of its characteristics does not readily take place.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A semiconductor laser device having a layered structure, said device comprising:
   an active layer;
   an n-type clad layer and a p-type clad layer sandwiching the active layer on both sides thereof;
   a substrate on which the active layer and the clad layers are provided; and
   electrodes in contact with the layered structure.
   the p-type clad layer including an inner clad area near the active layer, and an outer clad layer remote from the active layer and having a narrower bandgap than the inner clad area,
   a thickness and a composition of the inner clad area being set so that a beam can substantially exude from the active layer to the outer clad area.

2. A semiconductor laser device according to claim 1, wherein an Al composition ratio of the inner clad area is higher than that of the outer clad area.

3. A semiconductor laser device according to claim 2, wherein the outer clad area is formed of $(Al_xGa_{1-x})_{0.5}In_{0.5}P$ (where $0.4 \leq x \leq 0.8$), and the inner clad area is formed of $(Al_yGa_{1-y})_{0.5}In_{0.5}P$ (where $0.7 \leq y \leq 1.0$, and $(x+0.1) \leq y$).

4. A semiconductor laser device according to claim 1, wherein a thickness of the inner clad area is 50–200 Å.

5. A semiconductor laser device according to claim 1, wherein the inner clad area has a composition which is under tensile strain due to lattice-mismatching thereof with the substrate.

6. A semiconductor laser device having a layered structure, said device comprising:
   an active layer;
   an n-type clad layer and a p-type clad layer sandwiching the active layer on both sides;
   a barrier structure to electrons provided between the active layer and the p-type clad layer;
   a substrate on which the active layer, the clad layers, and the barrier structure are provided; and
   eletrodes in contact with the layered structure,
   the barrier structure being formed of a material which is under tensile strain due to lattice mismatching with the substrate.

7. A semiconductor laser device according to claim 6, wherein the barrier structure includes a single barrier layer.

8. A semiconductor laser device according to claim 6, wherein the barrier structure is a multi-barrier structure including barrier layers and well layers, each of the well layers including a material which has a narrower bandgap than the barrier layers, and each of the well layers being interposed between one of the barrier layers and an adjacent one thereof.

9. A semiconductor laser device according to claim 8, wherein the multi-barrier structure is a multi-quantum barrier structure including well layers interposed between one of the barrier layers and an adjacent one thereof.

10. A semiconductor laser device according to claim 8, wherein the layers between the barrier layers are compressively strained due to lattice-mismatching with the substrate.

11. A semiconductor laser device according to claim 8, wherein a material of the active layer is AlGaInP, that of the barrier layers is p-type $(Al_aGa_{1-a})_bIn_{1-b}P$, and that of the well layers between the barrier layers is p-type $(Al_cGa_{1-c})_dIn_{1-d}P$ with $1 \geq b > 0.5$ and $0.5 \geq d \geq 0$.

* * * * *